US 12,489,055 B2

(12) United States Patent
Wu et al.

(10) Patent No.: US 12,489,055 B2
(45) Date of Patent: Dec. 2, 2025

(54) SEMICONDUCTOR DEVICE AND METHOD FOR MAKING THE SAME

(71) Applicant: NANYA TECHNOLOGY CORPORATION, New Taipei (TW)

(72) Inventors: Yu-Hsin Wu, Taipei (TW); Hui Tzu Chan, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 441 days.

(21) Appl. No.: 18/052,575

(22) Filed: Nov. 4, 2022

(65) Prior Publication Data

US 2024/0153873 A1 May 9, 2024

(51) Int. Cl.
*H01L 23/528* (2006.01)
*G11C 5/06* (2006.01)
*H01L 21/02* (2006.01)
*H01L 23/532* (2006.01)
*H10B 12/00* (2023.01)
*H10D 62/13* (2025.01)

(52) U.S. Cl.
CPC ........ *H01L 23/5283* (2013.01); *G11C 5/063* (2013.01); *H01L 21/02236* (2013.01); *H01L 21/02255* (2013.01); *H01L 21/0228* (2013.01); *H01L 23/53295* (2013.01); *H10B 12/053* (2023.02); *H10B 12/34* (2023.02); *H10B 12/488* (2023.02); *H10D 62/151* (2025.01)

(58) Field of Classification Search
CPC .......... H01L 23/5283; H01L 21/02236; G11C 5/063; H10B 12/053; H10B 12/34; H10B 12/488; H10D 30/60; H10D 64/513
See application file for complete search history.

(56) References Cited

U.S. PATENT DOCUMENTS

| 10,790,287 | B2* | 9/2020 | Kang | ............... | H10B 12/34 |
| 2011/0018057 | A1* | 1/2011 | Kim | ............... | H10D 64/513 |
| | | | | | 438/270 |
| 2022/0028867 | A1* | 1/2022 | Chou | ............... | H10D 64/516 |

FOREIGN PATENT DOCUMENTS

| CN | 114823310 A | 7/2022 |
| TW | 202131486 A | 8/2021 |

* cited by examiner

*Primary Examiner* — Julia Slutsker
(74) *Attorney, Agent, or Firm* — CKC & Partners Co., LLC

(57) ABSTRACT

The present application discloses a semiconductor device and a method for making the same. The semiconductor device includes a substrate, a word line, a word line dielectric layer, and first and second source/drain regions. The word line is buried in the substrate. The word line dielectric layer is disposed between the substrate and the word line, and the word line dielectric layer includes: a first oxide layer and a second oxide layer. The first oxide layer is in contact with the word line and is formed by an atomic layer deposition (ALD) process. The second oxide layer is in contact with the substrate and is formed by a thermal oxidation process. The first and the second source/drain regions are disposed in the substrate and above the word line, wherein the word line is disposed laterally between the first and the second source/drain regions.

11 Claims, 8 Drawing Sheets

SEMICONDUCTOR DEVICE AND METHOD FOR MAKING THE SAME

BACKGROUND

Field of Invention

The present disclosure relates to semiconductor devices having buried word lines and methods of forming the same.

Description of Related Art

Semiconductor devices are used in a variety of electronic applications, such as personal computers, cellular telephones, digital cameras, and other electronic equipment. The dimensions of semiconductor devices are continuously being scaled down to meet the demand for ever-increasing computing ability. However, a variety of issues arise during the down-scaling process, and such issues are continuously increasing in quantity and complexity. Therefore, challenges remain in achieving improved quality, yield, performance, and reliability and reduced complexity.

SUMMARY

Some embodiments of the present disclosure provide a semiconductor device including a substrate, a word line, a word line dielectric layer, and a first source/drain region and a second source/drain region. The word line is buried in the substrate. The word line dielectric layer is disposed between the substrate and the word line, and the word line dielectric layer includes: a first oxide layer and a second oxide layer. The first oxide layer is in contact with the word line and is formed by an atomic layer deposition (ALD) process. The second oxide layer is in contact with the substrate and is formed by a thermal oxidation process. The first source/drain region and the second source/drain region are disposed in the substrate and above the word line, wherein the word line is disposed laterally between the first source/drain region and the second source/drain region.

In some embodiments, in the semiconductor device, the first oxide layer has a first thickness ranging from about 10 Angstroms (Å) to about 20 Å.

In some embodiments, in the semiconductor device, the second oxide layer has a second thickness ranging from about 40 Å to about 65 Å.

In some embodiments, in the semiconductor device, the first oxide layer has a first thickness, the second oxide layer has a second thickness, and a ratio of the first thickness to the second thickness ranges from about 1/2 to about 1/6.5.

In some embodiments, in the semiconductor device, the word line dielectric layer has a first total thickness at 40 nm above a bottom of the word line, a second total thickness at 20 nm down from a top of the word line, and a third total thickness at 20 nm above the top of the word line. The first total thickness is greater than the second total thickness, and the second total thickness is greater than the third total thickness.

In some embodiments, in the semiconductor device, the second total thickness is about 85% to about 98% of the first total thickness.

In some embodiments, in the semiconductor device, the third total thickness is about 68% to about 92% of the first total thickness.

In some embodiments, in the semiconductor device, the first total thickness ranges from about 50 Å to about 85 Å.

In some embodiments, in the semiconductor device, each of the first and the second source/drain regions and the word line are separated by the first oxide layer and the second oxide layer.

Some embodiments of the present disclosure provide a method for making a semiconductor device, and the method includes: providing a substrate; forming a trench in the substrate; performing an atomic layer deposition (ALD) process to form a first oxide layer in the trench; performing a thermal oxidation process to form a second oxide in the trench; filling conductive material into the trench to form a conductive layer; etching the conductive layer to form a word line; forming a first source/drain region and a second source/drain region, wherein the first and the second source/drain regions are disposed in the substrate and above the word line, and the word line is laterally disposed between the first and the second source/drain regions.

In some embodiments, the method further includes disposing a capping layer over the word line.

In some embodiments, in the method for making the semiconductor device, the first oxide layer has a first thickness ranging from about 10 Å to about 20 Å.

In some embodiments, in the method for making the semiconductor device, the second oxide has a second thickness ranging from about 40 Å to about 65 Å.

In some embodiments, in the method for making the semiconductor device, the thermal oxidation process is performed after the ALD process is performed.

In some embodiments, in the method for making the semiconductor device, the ALD process is performed after the thermal oxidation process is performed.

In some embodiments, in the method for making the semiconductor device, a word line dielectric layer is disposed between the word line and the substrate, the word line dielectric layer comprises the first oxide layer and the second oxide layer. The word line dielectric layer has a first total thickness at 40 nm above a bottom of the word line, a second total thickness at 20 nm down from a top of the word line, and a third total thickness at 20 nm above the top of the word line. The first total thickness is greater than the second total thickness, and the second total thickness is greater than the third total thickness.

In some embodiments, in the method for making the semiconductor device, the second total thickness is about 85% to about 98% of the first total thickness.

In some embodiments, in the method for making the semiconductor device, the third total thickness is about 68% to about 92% of the first total thickness.

In some embodiments, in the method for making the semiconductor device, the first total thickness ranges from about 50 Å to about 85 Å.

In some embodiments, in the method for making the semiconductor device, after the trench in the substrate is formed, the substrate has a substrate boundary exposed in the trench, and after the ALD process is performed, the first oxide layer has an oxide boundary exposed in the trench. The oxide boundary is offset from the substrate boundary by about 10 Å to 20 Å.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
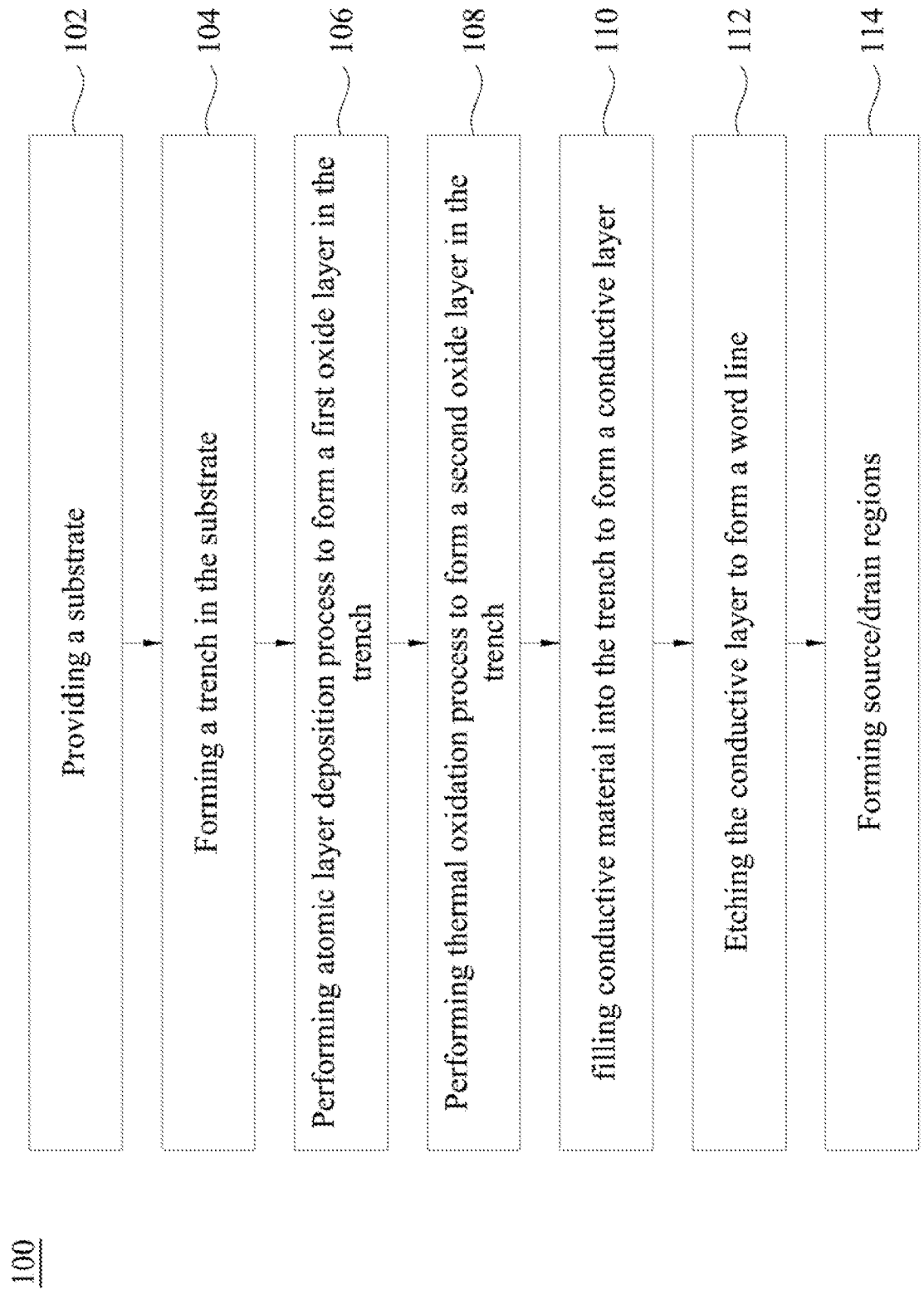
FIG. 1 is a flowchart of a method for making semiconductor devices, in accordance with some embodiments.

Reference will now be made in detail to the present embodiments of the invention, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device such as a DRAM device may include a plurality of buried-channel array transistors (BCAT). The buried-channel array transistor has a longer effective channel length compared with a planar transistor as its gate electrode is buried under a semiconductor substrate, such that the DRAM device may be downsized and the integration density thereof can be increased. However, as the cell size of DRAM device becomes smaller and smaller, the physical distance between a word line (gate) and a drain decreases, which increases the problem of gate-induced drain leakage (IGIDL) and the coupling capacitance between the word line and the drain.

Embodiments of the present disclosure provide semiconductor devices that can reduce GIDL and the coupling capacitance between word lines and drains, and manufacturing methods thereof.

Refer to FIG. 1 and FIGS. 2 to 8. FIG. 1 is a flowchart of a method for making semiconductor devices and FIGS. 2-8 illustrate partial cross-sectional views of intermediate stages in the making of semiconductor devices, in accordance with some embodiments.

Figure 2:
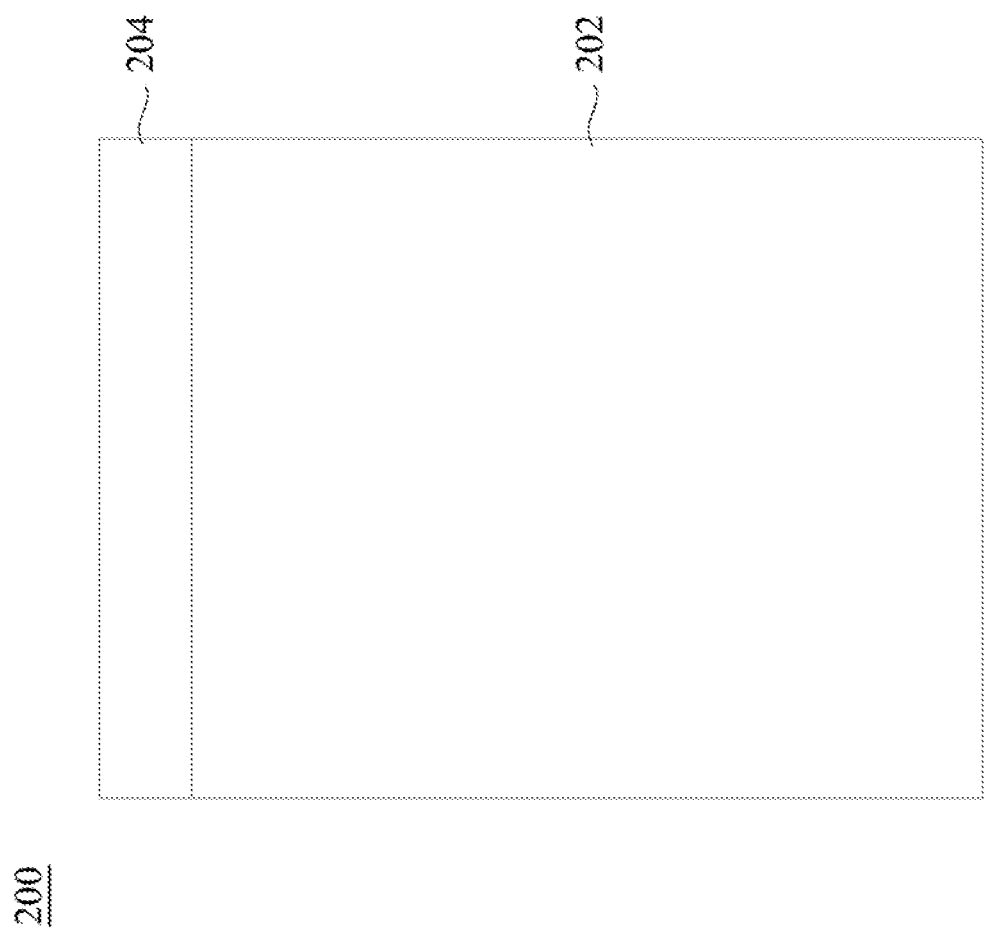
FIGS. 2-8 illustrate partial cross-sectional views of intermediate stages in the making of semiconductor devices, in accordance with some embodiments.

At step 102 of the method 100, a substrate is provided. FIG. 2 shows a semiconductor substrate 202 of a semiconductor device 200 according to some embodiments. The substrate 202 may be, for example, a bulk monocrystalline silicon substrate, a silicon-on-insulator (SOI) substrate, or other suitable substrates. In some embodiments, the semiconductor substrate 202 may be or comprises, for example, silicon, silicon carbide, gallium arsenide, silicon germanium, or the like. In some embodiments, a mask layer 204 is disposed over the semiconductor substrate, and the mask layer may be, for example, silicon nitride or other suitable materials. In some embodiments, before the subsequent etching process, a silicon oxynitride layer and/or a carbon layer (not shown) are further disposed on the substrate 202.

Figure 3:
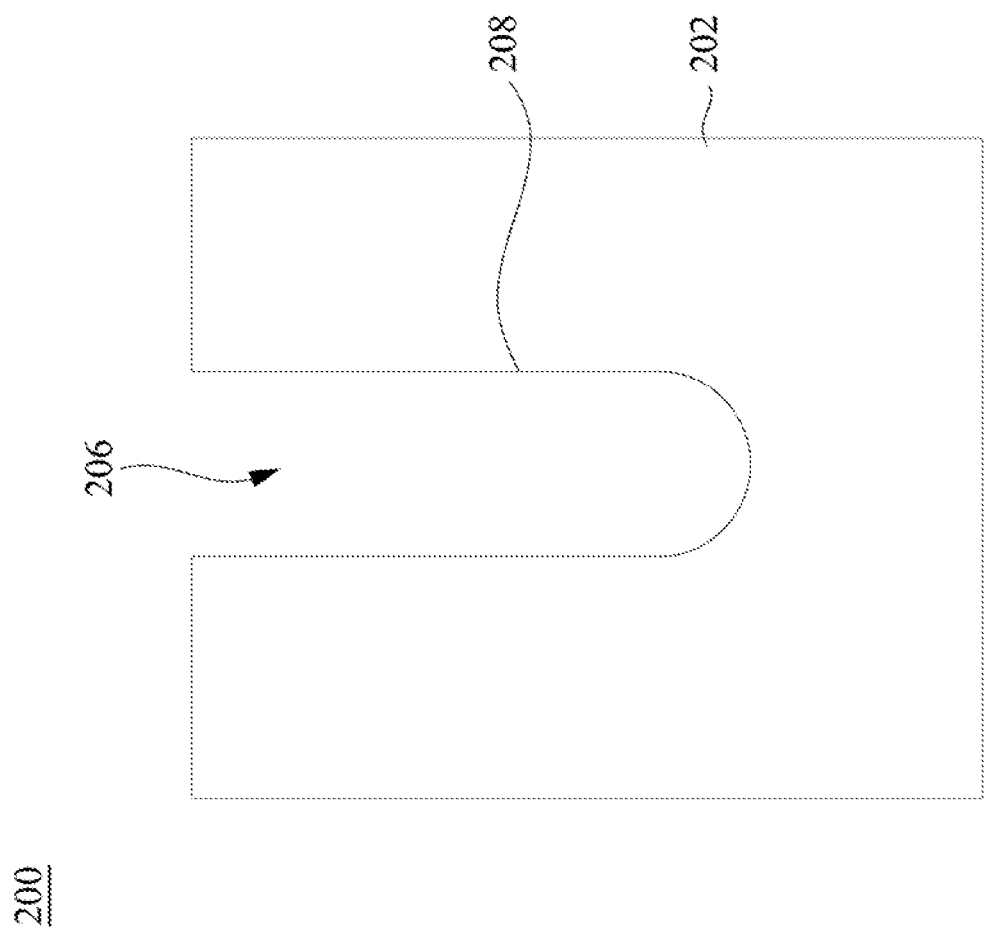

At step 104 of the method 100, a trench is formed in the substrate. As shown in FIG. 3, a trench 206 is formed in the substrate 202. In some embodiments, the depth of the trench 206 may be from about 100 nm to about 600 nm, for example, but the present disclosure is not limited thereto. The trench 206 is formed by an etching process. After the etching process, a substrate boundary 208 of the substrate 202 is exposed in the trench 206.

In some embodiments, the etching process is an anisotropic etching process or an isotropic etching process. In some embodiments, the etching process is a dry etching process or a wet etching process. In some embodiments, after the etching process, the mask layer 204 over the substrate 202 is removed.

Figure 4:
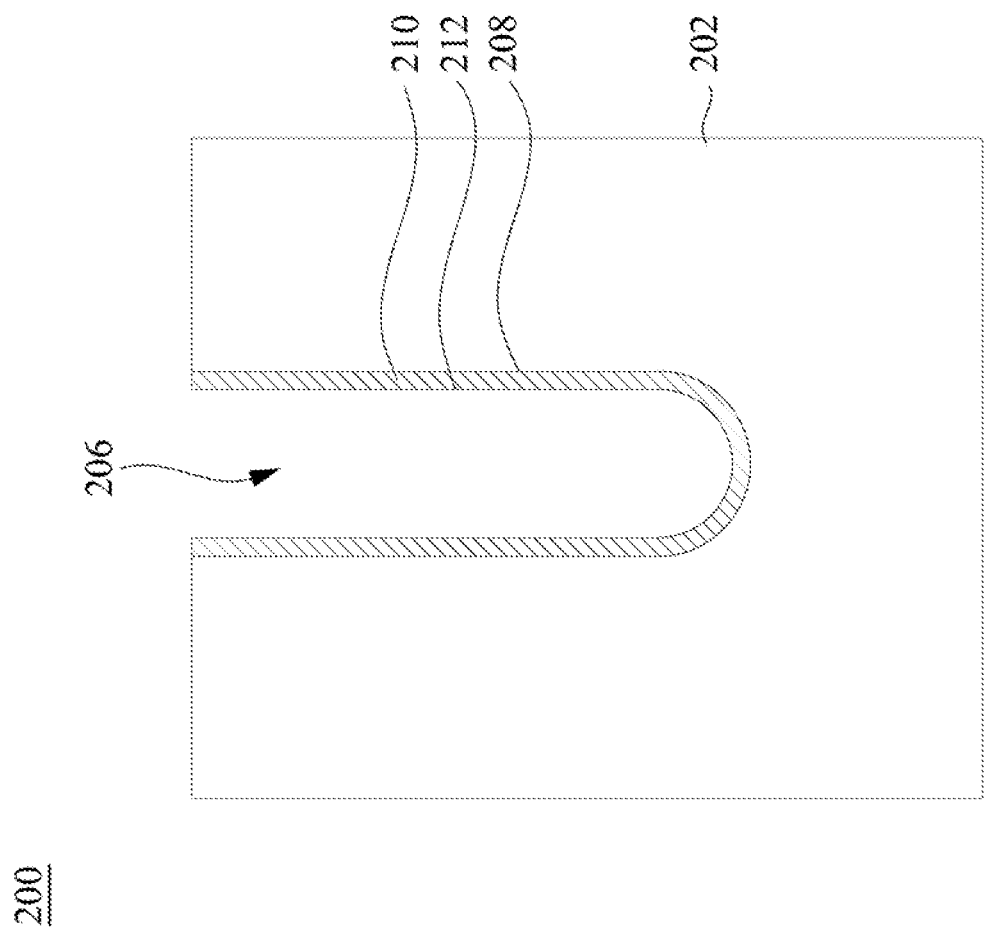

At step 106 of the method 100, an atomic layer deposition (ALD) process is performed to form a first oxide layer in the trench. As shown in FIG. 4, the first oxide layer 210 in the trench 206 is conformally deposited on the substrate boundary 208 of the substrate 202. In some embodiments, the material of the first oxide layer 210 may be, for example, silicon oxide, hafnium oxide, zirconium oxide, or other suitable material. The first oxide layer 210 has an oxide layer boundary 212 exposed in the trench.

At step 108 of the method 100, a thermal oxidation process is performed to form a second oxide layer in the trench. As show in FIG. 5, the second oxide layer 214 is formed on the side of the oxide layer boundary 212 opposite to the first oxide layer 210.

It is understood that the second oxide layer 214 formed by thermal oxidation is the oxidation reaction of the material of the substrate 202; that is, the position of the second oxide layer 214 was previously occupied by the original material of the substrate 202. In some embodiments, the thermal oxidation process is in-situ steam generation (ISSG). In some embodiments, the second oxide layer 214 is silicon oxide.

In some embodiments, the ALD process may be performed to form the first oxide layer 210 (step 106), followed by a thermal oxidation process to form the second oxide layer 214 (step 108). In other embodiments, a thermal oxidation process can be performed to form the second oxide layer 214 (step 108), and then an ALD process is performed (step 106) to form the first oxide layer 210 on the second oxide layer 214.

Figure 5:
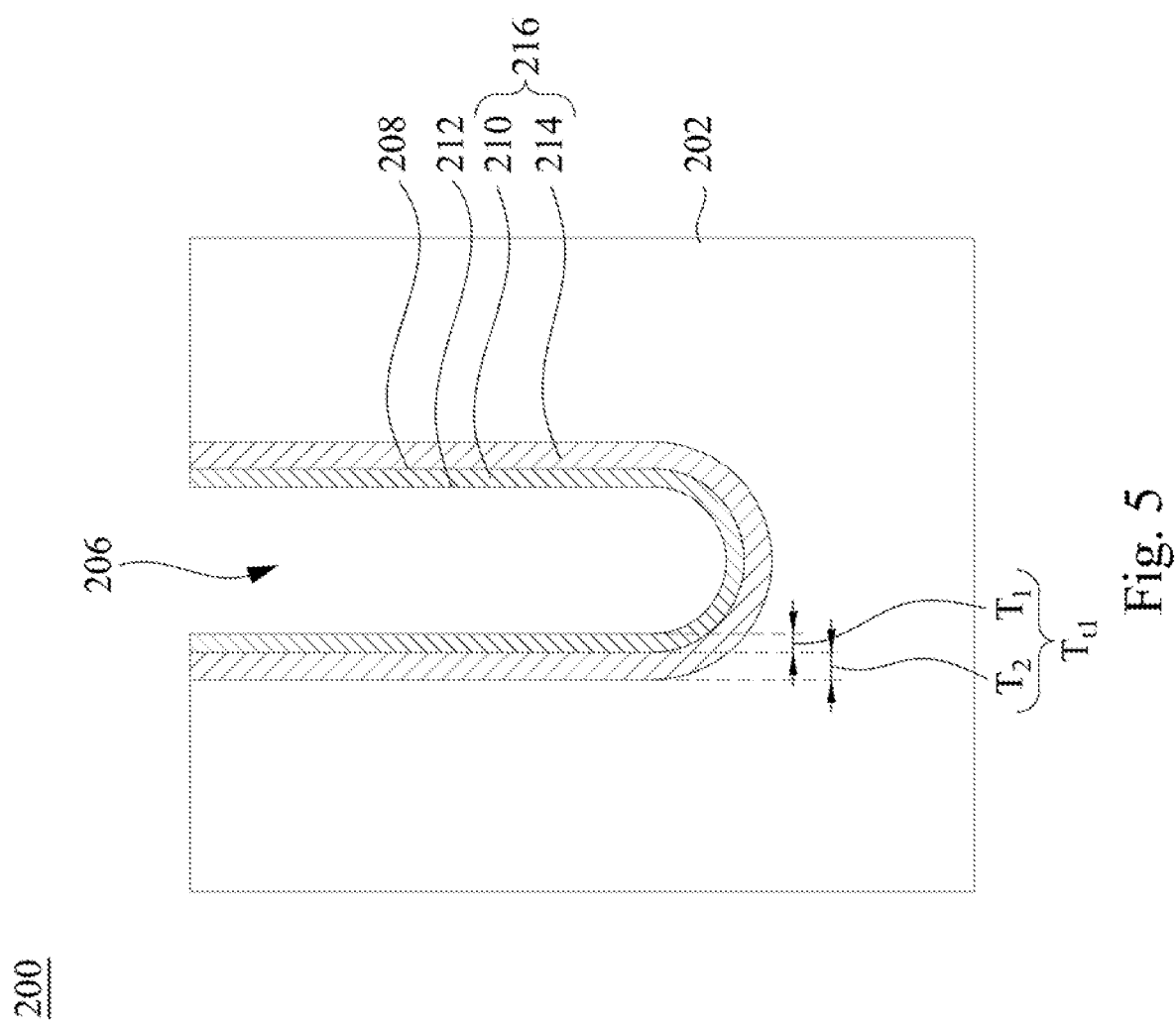

The first oxide layer 210 and the second oxide layer 214 are collectively referred to as a word line dielectric layer 216. As shown in FIG. 5, the first oxide layer 210 has a first thickness T1, the second oxide layer 214 has a second thickness T2, and the word line dielectric layer 216 has a first total thickness Tt1. Since the word line dielectric layer 216 is not etched, the entire first oxide layer 210 has a substantially uniform thickness, the entire second oxide layer 214 has a substantially uniform thickness, and the entire word line dielectric layer 216 has a substantially uniform total thickness.

In some embodiments, the first thickness T1 of the first oxide layer 210 ranges from about 10 Ångstroms (Å) to about 20 Å, such as 10 Å, 15 Å, 20 Å, or any value between any two of these values. In some embodiments, the second thickness T2 of the second oxide layer 214 ranges from about 40 Å to about 65 Å, such as 40 Å, 45 Å, 50 Å, 55 Å, 60 Å, 65 Å, or any value between any two of these values. In some embodiments, the first total thickness Tt1 of the word line dielectric layer 216 ranges from about 50 Å to about 85 Å, such as 50 Å, 55 Å, 60 Å, 65 Å, 70 Å, 75 Å, 80 Å, 85 Å, or any value between any two of these values.

In some embodiments, the ratio of the first thickness T1 of the first oxide layer 210 to the second thickness T2 of the second oxide layer 214 ranges from about 1/2 to about 1/6.5, such as about 1/2, 1/3, 1/4, 1/5, 1/6, 1/6.5, or any value between any two of these values.

Figure 6:
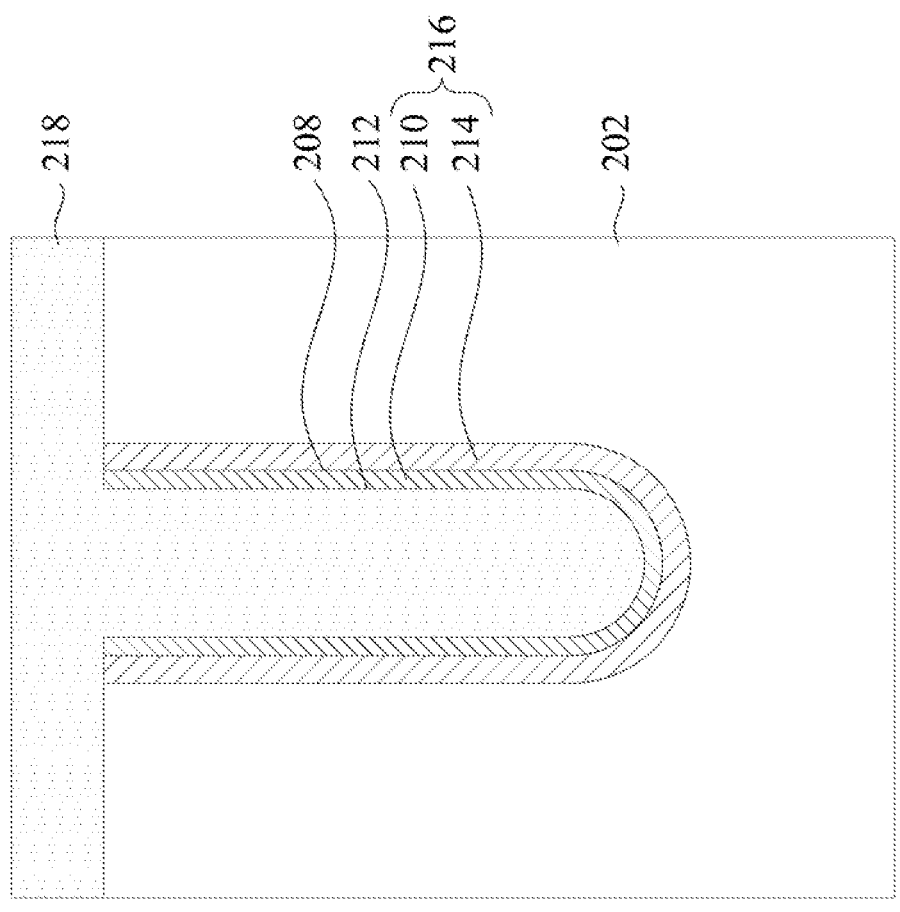

At step 110 of the method 100, a conductive material is filled in the trench to form a conductive layer. As shown in FIG. 6, which shows the conductive material is used to fill the trench 206 and form a conductive layer 218. In some embodiments, the conductive material may be selected from the group consisting of amorphous silicon, polycrystalline silicon, polycrystalline silicon germanium, metal nitride, metal silicide, metal oxide, and suitable metals. In some embodiments, the trench is filled with the conductive material by a deposition method, such as physical vapor deposition (PVD), chemical vapor deposition (CVD), ALD, or other suitable processes.

Figure 7:
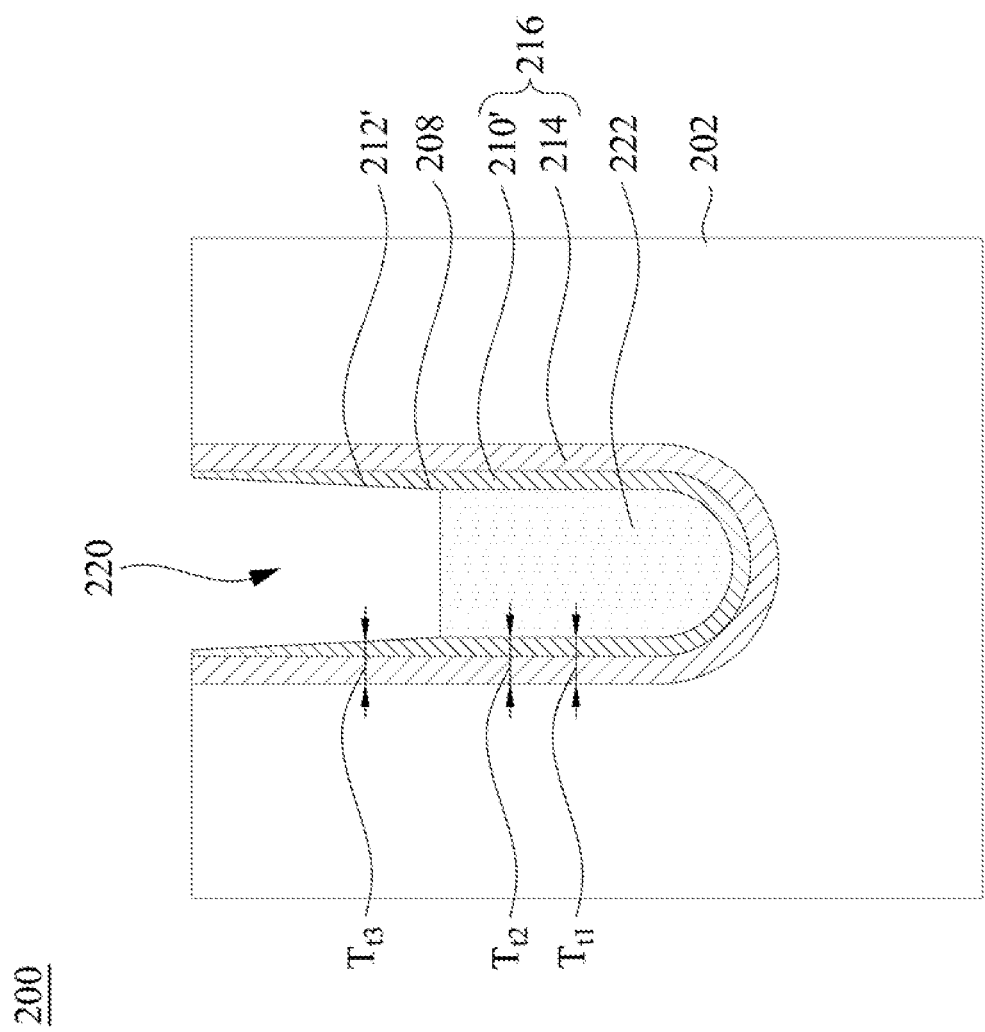

At step 112 of the method 100, the conductive layer is etched to form a word line. Referring to FIG. 7, after the conductive layer 218 is etched, a recess 220 and a word line 222 are formed. The excess conductive material is removed by a suitable etching process, such as wet etching or dry etching.

The upper portion of the first oxide layer 210 is partially consumed during the etching process. After the etching process, the upper portion of the first oxide layer 210' has a thickness smaller than the first thickness T1 of the first oxide layer 210.

In some embodiments, the etching loss of the word line dielectric layer 216 is mainly the loss of the first oxide layer 210. In other embodiments, there may be a partial loss of the second oxide layer 214. For example, at the upper part of the recess 220, the first oxide layer 210 may be lost due to etching, so the second oxide layer 214 is also partially lost and becomes thinner.

FIG. 7 shows three total thicknesses of the word line dielectric layer 216 at three positions. The word line dielectric layer 216 has a first total thickness $T_{t1}$ at 40 nm above the bottom of the word line 222, a second total thickness $T_{t2}$ at 20 nm below the top of the word line 222, and a third total thickness $T_{t3}$ at the 20 nm above the top of the word line 222. Since the portion of the first oxide layer 210 in the recess 220 contacts the etchant during the etching process, it will become thinner due to etching. The word line dielectric layer 216 below and near the top of the word line 222 may also be slightly etched due to the infiltration of the etchant. In addition, the portion of the word line dielectric layer 216 close to the middle or the bottom of the word line 222 is not affected by the etchant, so the word line dielectric layer 216 here maintains the total thickness (i.e., $T_{t1}$). Therefore, after the etching process, the first total thickness $T_{t1}$ is larger than the second total thickness $T_{t2}$, and the second total thickness $T_{t2}$ is larger than the third total thickness $T_{t3}$.

In some embodiments, the second total thickness $T_{t2}$ is about 85% to 98% of the first total thickness $T_{t1}$; in some examples more than 88% of the first total thickness $T_{t1}$, and still in some examples more than 90% of the first total thickness $T_{t1}$. In some embodiments, the third total thickness Tt3 is about 68% to 92% of the first total thickness $T_{t1}$, in some examples more than 71% of the first total thickness $T_{t1}$.

The conventional word line dielectric layer is typically formed of a thermally oxidized oxide layer, so the word line dielectric layer contacting the etchant will be obviously thinned during an etching process. The boundary of the oxide layer of the conventional word line dielectric layer is roughly equivalent to the substrate boundary, and after the etching process, the boundary of the oxide layer at the recess of the conventional word line dielectric layer will shift toward the substrate. That is, the thickness of the oxide layer between the word line and the drain will be significantly reduced by the etching process.

By comparison, the word line dielectric layer 216 in the semiconductor device of the embodiments of the present disclosure includes a first oxide layer 210 and a second oxide layer 214, wherein the first oxide layer 210 is formed on the surface of the substrate 202 (i.e., the substrate boundary 208) by an ALD process, so that the loss of the second oxide layer 214 during the etching process can be reduced, and the position of the oxide layer boundary 212' is shift from the substrate boundary 208. Accordingly, the total physical distance of the oxide layer between the word line and the drain is increased.

Figure 8:
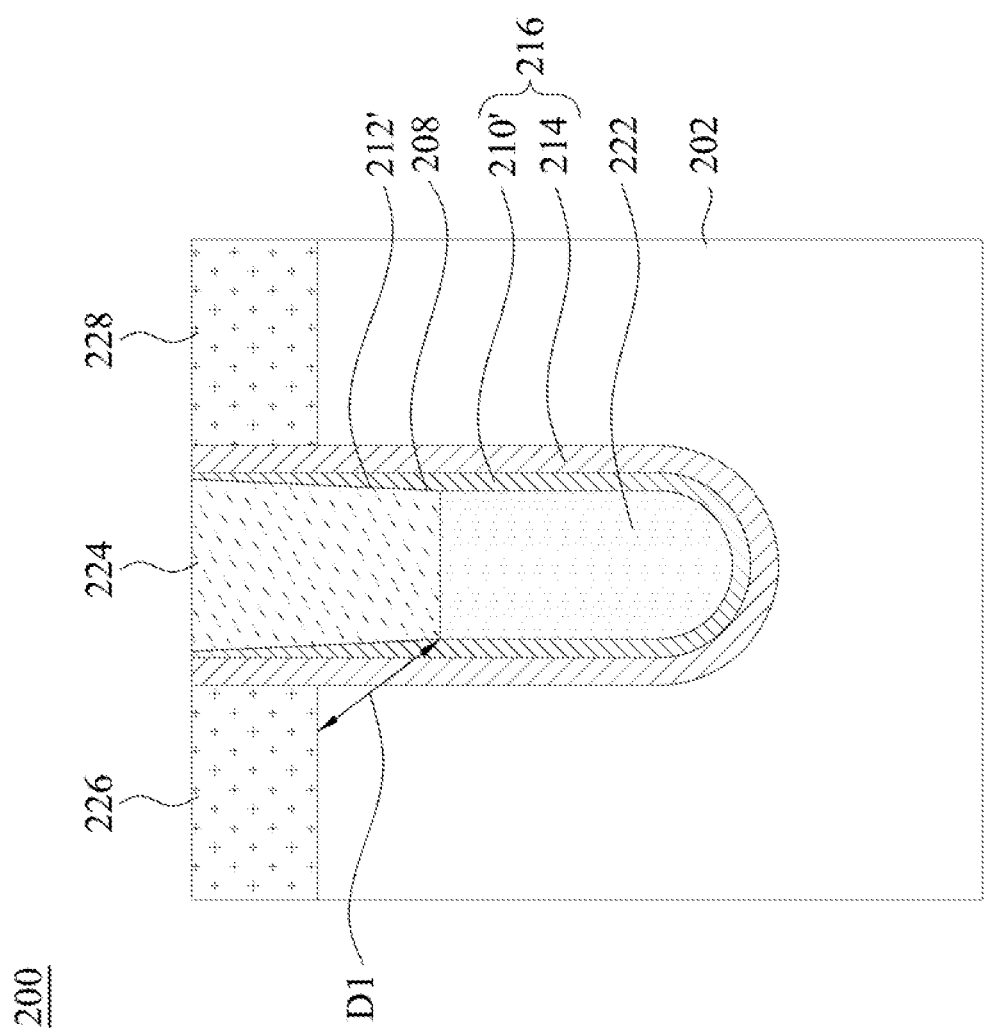

At step 114 of the method 100, source/drain regions are formed. FIG. 8 shows the first source/drain region 226 and the second source/drain region 228 are disposed in the substrate 202 and above the word line 222. The word line 222 is disposed laterally between the first source/drain region 226 and the second source/drain region 228. In some embodiments, a doped region, such as a lightly doped drain region (LDD), can be formed through a doping process. In some embodiments, the doping process may be performed before the etching process in step 104. In other embodiments, the doping process may be performed after step 112. In some embodiments, ion implantation process, plasma immersion ion implantation process, gas and/or solid source diffusion process, or other suitable processes may be used to perform the doping process. In some embodiments, after the doping process, an annealing process is performed to activate the dopants in the first source region and the second source/drain region.

FIG. 8 also shows that a capping layer 224 is formed over the word line. The capping layer 224 fills the space of the recess 220 and covers the word line 222. In some embodiments, the material of the cover layer 224 is an insulating material, such as silicon nitride, silicon oxide, silicon oxynitride, or other suitable materials. In some embodiments, the material of the capping layer 224 is first deposited over the word lines to fill the recesses and over the surface of the substrate 202 outside the recesses, and then the excess material of the capping layer 224 is removed by a chemical mechanical polishing (CMP) process.

As shown in FIG. 8, the word line 222 is separated from the first source/drain region 226 by a distance D1. The distance D1 crosses the word line dielectric layer 216, that is, both the first oxide layer 210 and the second oxide layer 214 provide the dielectric isolation between the word line and the first source/drain region 226.

The conventional word line dielectric layer is usually only composed of an oxide layer formed by thermal oxidation, so the word line and the drain are separated by this oxide layer. In contrast, the word line dielectric layer 216 of the embodiments of the present disclosure includes the first oxide layer 210 (or 210') formed by an ALD process and the second oxide layer 214 formed by a thermal oxidation process, so the word line 222 and the drain are separated by the first oxide layer 210 and the second oxide layer 214. In addition, the oxide layer formed by thermal oxidation is formed in the substrate, while the first oxide layer formed by ALD is formed on the surface of the substrate, thus the distance between the word line and the drain is increased.

The embodiments of the present disclosure provides a semiconductor device including includes the word line dielectric layer having an oxide layer formed by ALD process, which is lined on the surface of the substrate in the trench, and can help reduce the loss of the word line dielectric layer during the etching process for forming the buried word line. Therefore, the physical distance between the word line and the drain is increased, which leads to reduced IGIDL and the coupling capacitance between the dielectric word line and the drain, and thus enhances the performance of the semiconductor device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
    a substrate;
    a word line, buried in the substrate;
    a capping layer, buried in the substrate and located over the word line, wherein the capping layer comprises an insulating material;
    a word line dielectric layer, disposed between the substrate and the word line, wherein the word line dielectric layer comprises:
        a first oxide layer, in contact with the word line, wherein the first oxide layer is formed by an atomic layer deposition (ALD) process; and
        a second oxide layer, in contact with the substrate, wherein the second oxide layer is formed by a thermal oxidation process, and the first oxide layer and the second oxide layer both extend from a bottom of the word line to above the word line; and
    a first source/drain region and a second source/drain region, disposed in the substrate and above the word line, wherein the word line is disposed laterally between the first source/drain region and the second source/drain region;
    wherein an interface is between the word line and the capping layer, and a thickness of the word line dielectric layer below the interface is greater than another thickness of the word line dielectric layer above the interface.

2. The semiconductor device of claim 1, wherein the first oxide layer has a first thickness ranging from about 10 Ångstroms (Å) to about 20 Å.

3. The semiconductor device of claim 1, wherein the second oxide layer has a second thickness ranging from about 40 Å to about 65 Å.

4. The semiconductor device of claim 1, wherein the first oxide layer has a first thickness, the second oxide layer has a second thickness, and a ratio of the first thickness to the second thickness ranges from about 1/2 to about 1/6.5.

5. The semiconductor device of claim 1, wherein the word line dielectric layer has:
    a first total thickness, at 40 nm above a bottom of the word line;
    a second total thickness, at 20 nm down from a top of the word line; and
    a third total thickness, at 20 nm above the top of the word line;
    wherein the first total thickness is greater than the second total thickness, and the second total thickness is greater than the third total thickness.

6. The semiconductor device of claim 5, wherein the second total thickness is about 85% to about 97% of the first total thickness.

7. The semiconductor device of claim 5, wherein the third total thickness is about 68% to about 92% of the first total thickness.

8. The semiconductor device of claim 5, wherein the first total thickness ranges from about 50 Å to about 85 Å.

9. The semiconductor device of claim 1, wherein each of the first and the second source/drain regions and the word line are separated by the first oxide layer and the second oxide layer.

10. The semiconductor device of claim 1, wherein a thickness of the first oxide layer below the interface is greater than a thickness of the first oxide layer above the interface.

11. The semiconductor device of claim 10, wherein a thickness of the second oxide layer below the interface is substantially equal to a thickness of the second oxide layer above the interface.

* * * * *